United States Patent
Yamane et al.

[11] Patent Number: 5,719,806
[45] Date of Patent: Feb. 17, 1998

[54] MEMORY CELL ARRAY

[76] Inventors: Masatoshi Yamane, 505 Mezon-Asahi, 2-2-7 Jonan, Ikeda-shi, Osaka-fu; Masahiro Matsuo, 3-2-43 Suimeidai, Kawanishi-shi, Hyogo-ken, both of Japan

[21] Appl. No.: 88,987

[22] Filed: Jul. 8, 1993

Related U.S. Application Data

[63] Continuation-in-part of Ser. No. 837,254, Feb. 14, 1992, abandoned.

[30] Foreign Application Priority Data

| Feb. 18, 1991 | [JP] | Japan | 3-046227 |
| Oct. 25, 1991 | [JP] | Japan | 3-306624 |
| Dec. 11, 1991 | [JP] | Japan | 3-351453 |

[51] Int. Cl.⁶ ................................ G11C 16/06
[52] U.S. Cl. ............ 365/185.16; 365/104; 365/230.06
[58] Field of Search ........................ 365/185, 104, 365/230.06, 185.16

[56] References Cited

U.S. PATENT DOCUMENTS

| 4,404,659 | 9/1983 | Kihara et al. | 365/185 |
| 4,527,256 | 7/1985 | Giebel | 365/154 |
| 4,723,225 | 2/1988 | Kaszubiniski et al. | 365/185 |
| 4,760,555 | 7/1988 | Gelsomini et al. | 365/185 |
| 4,868,790 | 9/1989 | Wilmoth et al. | 365/210 |
| 4,992,980 | 2/1991 | Park et al. | 365/104 |
| 5,016,216 | 5/1991 | Ali | 365/185 |
| 5,020,026 | 5/1991 | Schreck et al. | 365/104 |
| 5,021,847 | 6/1991 | Eitan et al. | 357/23.5 |
| 5,022,008 | 6/1991 | Schreck et al. | 365/201 |
| 5,023,680 | 6/1991 | Gill et al. | 357/23.5 |
| 5,023,837 | 6/1991 | Schreck et al. | 365/185 |
| 5,027,321 | 6/1991 | Park | 365/185 |
| 5,031,148 | 7/1991 | Kitazawa et al. | 365/189.09 |
| 5,117,389 | 5/1992 | Yiu | 365/104 |
| 5,197,029 | 3/1993 | Schreck et al. | 365/185.16 |
| 5,241,497 | 8/1993 | Komarek | 365/104 |
| 5,315,541 | 5/1994 | Harari et al. | 365/185.16 |
| 5,319,593 | 6/1994 | Wolstenholme | 365/185 |

FOREIGN PATENT DOCUMENTS

| 62-67857 | 3/1987 | Japan . |
| 2224162 | 4/1990 | United Kingdom . |

OTHER PUBLICATIONS

R. Kazerounian et al., "Alt. Met. Virt. GNP EPROM Array . . . ", IEEE IEDM Tech. Dig. Proc., Dec. 7, 1991, pp. 311–314.

M. Okada et al., 16 Mb ROM Design Using Bank Select Architecture, 1988 Symposium on VLSI Circuits, Digest of Technical Papers, pp.85–86.

*Primary Examiner*—Joseph E. Clawson, Jr.
*Attorney, Agent, or Firm*—Cooper & Dunham LLP

[57] ABSTRACT

A memory cell array of high density, enabling high speed read-out. Diffusion wires columnwise extending in a block in the array serve as bit and ground lines alternately disposed and gate wires parallel to each other are formed perpendicularly to the diffusion wires. Channels are defined in regions between the adjacent diffusion wires under the gate wires, whereby MOS transistors are formed. A memory circuit has such a memory cell array and a decoder connected thereto. Paired adjacent bit lines are connected through a bit line select transistor to a contact, and the contact is connected through a metal line columnwise connecting between blocks, via a transistor of decoder to a main bit line. Paired adjacent ground lines are connected through a ground line select transistor to a contact for ground line, and the contact is connected through a metal line columnwise connecting between blocks, via a transistor of decoder to a main ground line.

9 Claims, 2 Drawing Sheets

MEMORY CELL ARRAY

CROSS REFERENCE TO RELATED APPLICATION

This is a Continuation-In-Part application of U.S. patent application Ser. No. 07/837,254 filed Feb. 14, 1992 now abandoned.

BACKGROUND OF THE INVENTION

1. Field of the Invention

The present invention relates to a read only memory (ROM). More particularly, the invention relates to a memory cell array in which a plurality of diffusion wires are formed in parallel with each other on a single crystal semiconductor substrate, a plurality of gate wires insulated from the diffusion wires are formed in parallel with each other and perpendicularly to the diffusion wires, and channels are defined in regions between the diffusion wires under the gate wires. It also relates to a memory circuit comprising such a memory cell array and a decoder for read-out.

2. Description of the Related Art

There is proposed a memory cell array of planar structure, having memory cells of high density made not by the LOCOS (Localized Oxidation of Silicon) but by the pn junction to isolate elements, and having bit lines formed by diffusion layers. For example, Japanese Laid-Open Patent Publication No. 67857/1987 discloses such a memory cell array.

It is considered to divide such a memory cell array into blocks and to select bit lines for each block in order to reduce a load on the bit lines. The density of memory cells and read-out speed will differ depending on the structure outside the block.

SUMMARY OF THE INVENTION

It is an object of the present invention to provide a memory cell array having high density memory cells and high speed read-out as well, and also to provide a memory circuit using the memory cell array.

According to the present invention, the memory cell array, having for example U.S. Pat. No. 4,194,804 memory cells, is divided into blocks arranged into rows and columns, for example 16,884 blocks, diffusion wires serve as bit lines and ground lines alternately in the block, a plurality of memory cells are connected in parallel between one of the bit lines and an adjacent one of the ground lines, each of the bit lines is independent of the other bit lines which are disposed within the other blocks and also within the same block, and the respective bit lines are connected through a bit line select transistor of the same structure as the memory cells to a metal line for the bit lines common for the columnwise blocks.

In order to reduce the load on the ground lines for high speed read-out, each of the ground lines is made independent of the other ground lines which are disposed within the other blocks and also within the same block, and the respective ground lines are connected through a ground line select transistor of the same structure as the memory cells to a metal line for the ground lines common for the columnwise blocks.

To obtain further high density memory cells, the bit line select transistors and the ground line select transistors are located at the opposite ends in each block.

If a memory cell array is divided into blocks and block select transistors are provided individually to select the respective blocks, an area is required for each of the block select transistors on a chip. However, according to the present invention, the bit line select transistors in each block also serve as block select transistors, saving the area on the chip.

The ground lines are not always fixed at a ground potential, but only one of them is earthed in correspondence with a position of memory cell to be selected and the other ground lines are set in a floating condition or precharge level. If the ground lines are connected continuously from block to block, a substantial time is required to reach the stable earth potential after the ground lines are earthed, with an increase in the number of blocks, in turn resulting in spending a long time to read out information in memory cell. In the present invention, the ground lines in unselected blocks are separated out from the metal line for ground line common for blocks by the ground line select transistors, resulting in load reduction on the ground line involved in the read-out of the memory cell in the selected block.

If the bit line select transistors and the ground line select transistors are located adjacent to each other in a block, a wiring resistance will occur due to doubled distance of diffusion wiring to and from the memory cell selected in the block. The resistance must be restricted below a certain value in relation with the resistance of the selected memory cell. Then, the number of memory cells would be restricted for lay-out in a block, obstructing to increase the degree of integration. The present invention solved the problem by locating the bit line select transistors and the ground line select transistors at the other ends from each other in a block, whereby the resistance due to diffusion wiring is made constant and small.

Since each paired bit lines are connected through paired bit line select transistors corresponding thereto to a metal line for bit lines columnwise connecting between the blocks, only one metal line for bit line is sufficient for two bit lines. Also since each pair of the ground lines are connected through paired ground line select transistors corresponding thereto to a metal line for ground line columnwise connecting between the blocks, only one metal line for ground line is also sufficient for two ground lines.

Further objects and advantages of the present invention will be apparent from the following description of the preferred embodiments of the invention as illustrated in the accompanying drawings.

DESCRIPTION OF THE PREFERRED EMBODIMENTS

Figure 1:
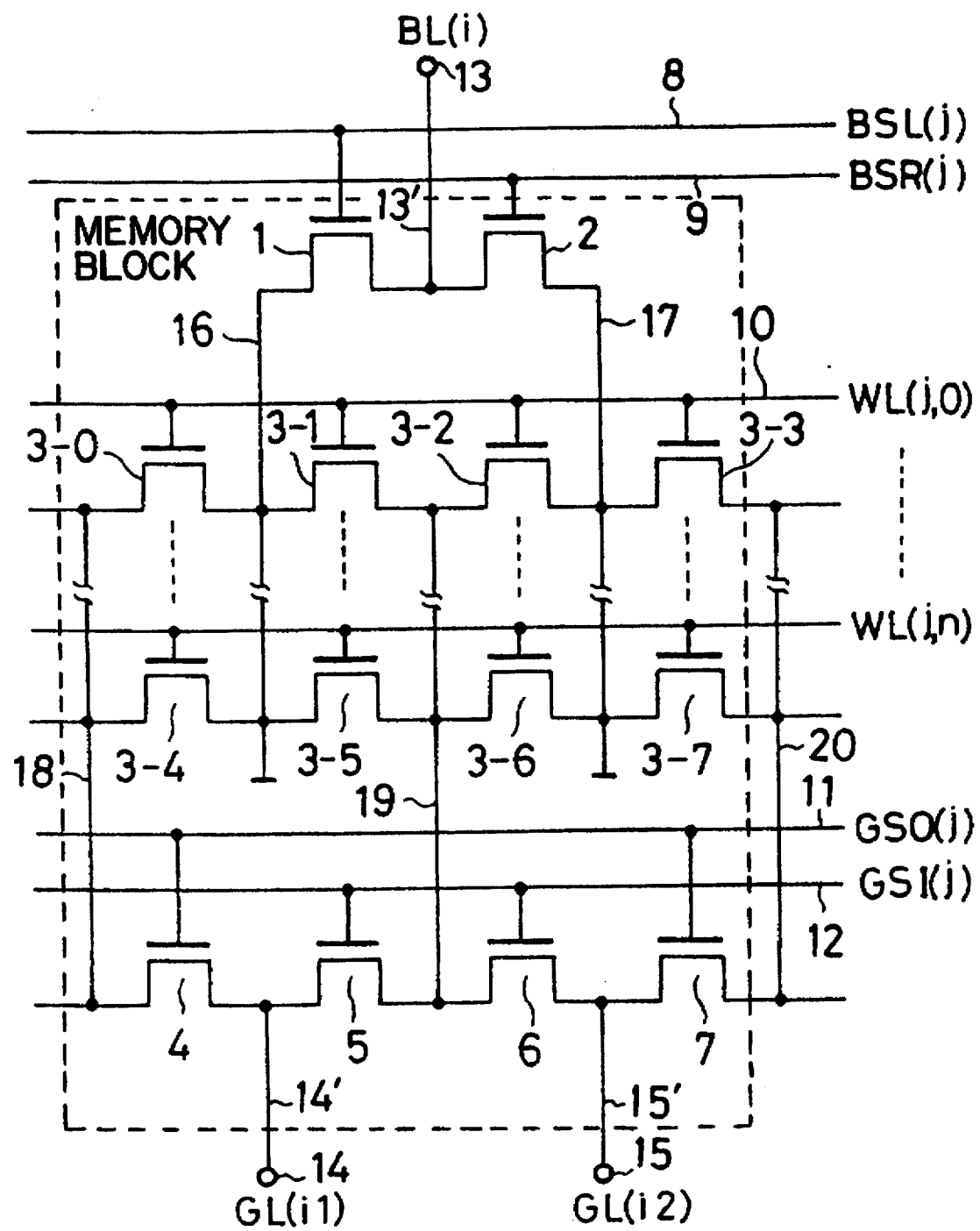
FIG. 1 is an equivalent circuit diagram to illustrate a preferred embodiment of a memory cell array according to the present invention.

FIG. 1 is an equivalent circuit diagram of a preferred embodiment of a memory cell array according to the present invention, showing a block of the memory cell array which has been sectioned into blocks in rows and columns. That is, the memory cell array is divided, for example, into 512 groups in a direction of row and 32 groups in a direction of column, thus forming blocks which number is 16,384.

Reference numerals 16, 17 denote bit lines, and reference numerals 18, 19, 20 denote ground lines, which are n-type diffusion wires formed in parallel with each other on a p-type silicon substrate. The diffusion wires are isolated by pn junction isolation. In FIG. 1, they are arranged left to right in the order of ground line 18, bit line 16, ground line 19, bit line 17, and ground line 20. In addition, a secondary bit line 13' and secondary ground lines 14', 15' are also diffusion wires. Gate wires, which are insulated from these diffusion wires 16 to 20 by means of a $SiO_2$ film, are formed in parallel with each other on the substrate and perpendicularly to the diffusion wires 16 to 20. The gate wires serve as word lines 10 (WL(j,0) to WL(j,n)), bit line select lines 8, 9, and ground line select lines 11, 12. The numeral j is an integer between 0 to 31. The gate wires 8, 9, 10, 11, 12 are wiring of polysilicon or polycided polysilicon, where the polycide is of double layers of polysilicon and silicide laid thereon. Each region between two adjacent diffusion wires under the gate wire defines a channel between source and drain regions, which are formed at their intersections, forming a MOS transistor. Memory cells 3-0, 3-1, ... are formed such that the channel stores data for example by the ion implantation which changes a threshold level of the MOS transistor. They may also be formed by connecting or disconnecting the transistor with the bit line. Actually, memory cell 3-0 is formed between ground line 18 and bit line 16 under gate wire WL(j,0). Memory cell 3-7 is formed between bit line 17 and ground line 20 under gate wire WL(j,n). The number of gate wires WL(j,0) ... WL(j,n) is, for example, sixty four, so n is 63. A transistor 1 is formed between bit line 16 and secondary bit line 13', a transistor 2 is formed between secondary bit line 13' and bit line 17. A transistor 4 is formed between ground line 18 and secondary ground line 14', a transistor 5 is formed between secondary ground line 14' and ground line 19, a transistor 6 is formed between ground line 19 and secondary ground line 15', and a transistor 7 is formed between secondary ground line 15' and ground line 20. The bit line 16 is connected through the bit line select transistor 1 and the secondary bit line 13' to a contact 13, the bit line 17 through the bit line select transistor 2 and the secondary bit line 13' to the contact 13, and the contact 13 through an unrepresented metal line of aluminum or aluminum alloy BL(i), which is common for the columnwise blocks, and Y decoder (not shown) to a common, sense amplifier (not shown). The numeral i is an integer between 0 to 511. In other words, the secondary bit line 13' is connected to the drains of transitors 1, 2. A gate electrode of the bit line select transistor 1 receives a bit line select signal BSL(j) through the line 8. A gate electrode of the bit line select transistor 2 receives a bit line select signal BSR(j) through the line 9.

A ground line contact 14 is connected through the secondary ground line 14' and the ground line select transistor 4 to the ground line 18, and through the secondary ground line 14' and the ground line select transistor 5 to the ground line 19. A ground line contact 15 is connected through the secondary ground line 15' and the ground line select transistor 6 to the ground line 19 and through the secondary ground line 15' and the ground line select transistor 7 to the ground line 20. In other words, the secondary ground line 14' is connected to the sources of transistors 4, 5. The secondary ground line 15' is connected to the sources of transistors 6, 7. Gate electrodes of the ground line select transistors 4, 7 receive a ground select signal GSO(j) through the line 11, and gate electrodes of the ground line select transistors 5, 6 a ground select signal GSI(j) through the line 12. The ground line contacts 14, 15 are connected through an unrepresented metal line of aluminum or aluminum alloy GL(i,1), GL(i, 2), which are common for the columnwise blocks, to an earthed terminal or kept floating as selected by a Y earth-decoder (not shown).

The bit line select transistors 1, 2 and the ground line select transistors 4, 5, 6, 7 are MOS transistors of the same structure as the memory cells.

Below described is an operation of the memory cell array in FIG. 1.

Suppose the memory cell 3-2 is selected, as an example. The select signal BSR(j) goes high and the signal BSL(j) is held low to turn on the bit line select transistor 2, so that the right half region of the block is selected.

The select signal GSI(j) of the line 12 goes to the high level and the select signal GSO(j) of the line 11 is held at the low level to turn on the ground line select transistor 6, so that the ground line 19 is turned to be effective.

The secondary ground line 14' to which the contact 14 is connected is kept in a floating state, and the common ground line 15' to which the contact 15 is connected, is held at the low level.

Then, the word line 10 (WL(j,0)), which is connected to the gate electrode of memory cell 3-2, is made high, and the other word lines are kept low, to read out storage information in the memory cell 3-2. If the storage information in the memory cell 3-2 is "1", i.e., if the memory cell transistor is on, the potential of the main bit line connected to the contact 13 becomes low. Alternatively, if the storage information is "0", i.e. if the memory cell transistor is off, the potential of main bit line connected to the contact 13 stays at the potential of the sense amplifier or high level.

When any block in the direction of the row is not selected, the blocks may be separated out from the main bit line by keeping the select signal BSL(j) of line 8 and the select signal BSR(j) of line 9 at the low level.

Also, the select signal GSO(j) of the ground select line 11 and the select signal GSI(j) of the ground select line 12 are kept at the low level to separate out any block in the direction of the row from the common ground line.

Figure 2:
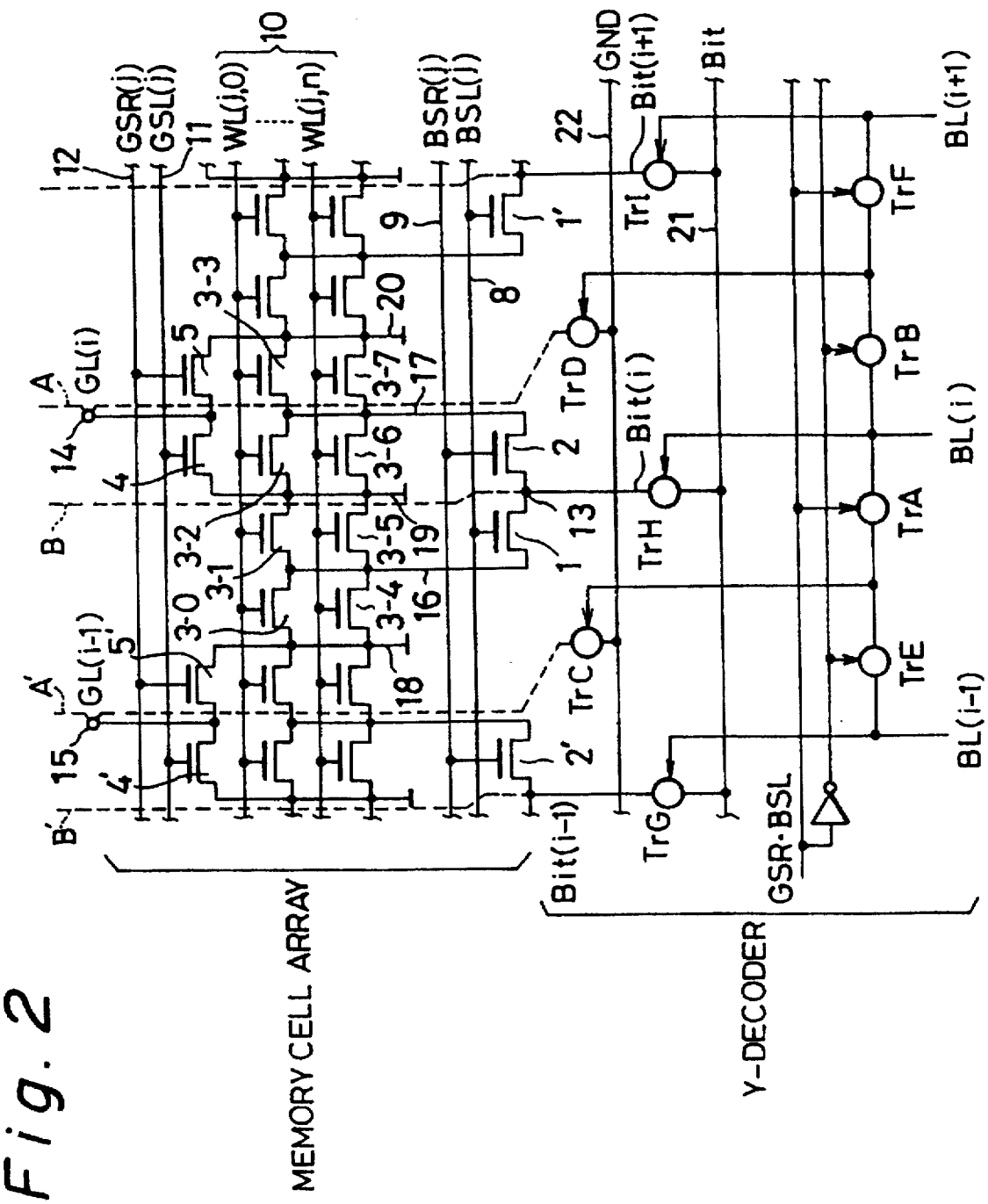
FIG. 2 is an equivalent circuit diagram to illustrate another preferred embodiment of a memory cell array according to the present invention.

FIG. 2 is an equivalent circuit diagram of another preferred embodiment of a memory cell array according to the present invention, in which is illustrated one block and halves of its right side and left side blocks of the memory cell array in the upper half and a Y decoder to select bit lines and ground line metal lines in the lower half.

Wires 16 to 20 extending columnwise or in the vertical direction in the block are ground lines 18, 19, 20 and bit lines 16, 17. They are diffusion wires formed in parallel with each other on a silicon substrate, arranged in the order of the ground line 18, the bit line 16, the ground line 19, the bit line 17, and so forth. Gate wires, which are insulated from these diffusion wires 16 to 20, are formed in parallel with each other and perpendicularly to the diffusion wires 16 to 20 on the substrate. The gate wires serve as word lines 10 (WL(j, 0))-WL(j,n)), bit line select lines 8, 9, and ground line select lines 11, 12. The gate wires 8, 9 10, 11, 12 are made of polysilicon or polycide. Each region between two diffusion wires under the gate wire defines a channel, forming a MOS transistor. Memory cells 3-0, 3-1 ... are formed by storing data by changing the threshold level of the MOS transistor by ion implantation. They may also be formed by connecting or disconnecting the transistor with the bit lines. The above structure of memory cell array is substantially the same as that in FIG. 1.

Watching the bit line and the ground line relating to four columns of the memory cell array including memory cells 3-0 to 3-3, respectively, a pair of two adjacent bit lines 16 and 17 are connected through the respective bit line select transistors 1, 2 to the contact 13, and the contact 13 is columnwise connected through a metal line B of aluminum or aluminum alloy between the blocks, via a transistor TrH to the main bit line 21. A sense amplifier (not shown) is connected to the bit line 21. A gate electrode of the bit line select transistor 1 receives a bit line select signal BSL(j) through the bit line select line 8, and a gate electrode of bit line select transistor 2 receives a bit line select signal BSR(j) through the bit line select line 9.

A pair of adjacent ground lines 19, 20 are connected through the respective ground line select transistors 4, 5 to the ground line contact 14, and the contact 14 is columnwise connected through a metal line A of aluminum or aluminum alloy between the blocks, via a transistor TrD to the main ground line 22. The main ground line 22 is earthed. The ground line 18 is connected through the ground line select transistor 5' to a contact 15 shared with a ground line select transistor 4', and the contact 15 is columnwise connected through a metal line A' of aluminum or aluminum alloy between the blocks, via a transistor TrC to the main ground line 22. Gate electrodes of the ground line select transistors 4, 4' receive a ground line select signal GSL(j) through the ground line select line 11, and gate electrodes of the ground line select transistors 5, 5' receive a ground line select signal GSR(j) through the ground line select line 12.

The bit line select transistors 1, 2, 1', 2' and the ground line select transistors 4, 5, 4', 5' are MOS transistors of the same structures as the memory cells.

Gate electrodes of transistors TrG, TrH, ... each select the respective bit line metal line B' (Bit(i−1)), B (Bit(i)), ... so as to receive bit line metal line select signals BL(i−1), BL(i), ..., respectively. The transistor TrC selects the ground line metal line A' (GL(i−1)) so as to receive the select signal BL(i−1) through the transistor TrE, and receive the select signal BL(i) through the transistor TrA. The transistor TrD selects the ground line metal line A (GL(i)) so as to receive the select signal BL(i) through the transistor TrB, and the select signal (BL(i+1)) through the transistor TrF. Gate electrodes of the transistors TrA, TrF receive an AND signal GSR·BSL, and gate electrodes of the transistors TrE, TrB receive an inverted signal of the AND signal GSR·BSL. The GSR is a binary addition, that is, GSR=GSR(0)+GSR(1)+ . . . +GSR(31), and the BSL also is a binary addition, that is, BSL=BSL(0)+BSL(1)+ . . . +BSL(31). The transistors TrA, TrB, TrC, TrD, . . . constitute a Y decoder section, which receives the bit line select signal BSL, the ground line select signal GSR, and the bit line metal line select signals BL(i−1), BL(i), . . . to connect a predetermined metal bit line to the main bit line 21 and to connect a predetermined metal ground line to the main ground line 22 to read out a predetermined memory cell.

Below described is an operation of the memory circuit in FIG. 2.

Suppose the memory cell 3-2 is selected, as an example.

To select a row of memory cells 3-0 to 3-3, the word line select signal WL(j, 0) is made high and the other word line select signals are kept low. Then, to transmit the level of bit line metal line Bit(i) to the main bit line 21, the bit line metal line select signal BL(i) is made high, and the other bit line metal line select signals are held at the low level. The signals BSR(j) and GSL(j) go high and the signals BSL(j) and GSR(j) are held low in order to turn on the bit line select transistor 2 both for block selection and for memory cell selection, to turn off the transistor 1, to turn on the ground line select transistor 4 for ground line separation, and to turn off the transistor 5. Thus, the transistor TrD is turned on in the Y decoder section, so that the ground level is transmitted from the ground line metal line (GL(i)) through the transistor 4 to the ground line 19. If storage information in the memory cell 3-2 is "1", i.e., if the transistor is on, the potential of the bit line 17 becomes low. Alternatively, if the storage information in the memory cell 3-2 is "0", i.e., if the transistor is off, the potential of the bit line 17 is held at the current potential. Either of the potentials is transmitted through the transistor 2 and the Y decoder section to the main bit line 21. Thus, the ground lines metal line except GL(i) are held in the floating state by the Y decoder section.

Also, to select memory cell 3-0, the bit line metal line select signal BL(i) is made high and the level of the bit line metal line Bit(i) is transmitted to the main bit line 21 in a manner similar to that described above. However, since the signals BSL(j), GSR(j) are high and the signals BSR(j), GSL(j) are low, the ground level is transmitted through the ground line metal line GL(i−1), keeping the metal line GL(i−1) at ground and the other ground line metal lines in the floating state. This selection of the ground line metal line is carried out by transistors TrA, TrB, TrC, TrD in the Y decoder section.

The block may be kept in an unselected state by keeping the bit line select signals BSL(j), BSR(j) low. Also, the ground line may be separated out by keeping the ground line select signals GSL(j), GSR(j) low.

Since the bit line select transistors also may be used for block selection in the memory cell array and in the memory circuit of the above described embodiments according to the present invention, it is unnecessary for extra transistors to be set for block selection, resulting in a reduction of the number of transistors, which in turn allows the memory cell array to be high density.

In addition, since the bit lines of diffusion wires are always located at the drain side of memory cell transistor in a block, a load thereon always remains constant irrespective of the position of a selected memory cell, minimizing the time difference for read out of information between memory cells.

Each of the ground lines is independent of the other ground lines between blocks and the ground line select transistors also serve for ground line separation, so that a load on the ground lines may be reduced so as to increase the read-out speed.

Furthermore, since the bit line select transistors and the ground line select transistors are located at opposite ends to each other in a block, the diffusion wire resistance may be minimized and kept at a constant level in the block, making the read-out stable.

Specifically, the number of metal lines connecting the blocks is one to two bit lines in the memory cell array and one to two ground lines, reducing the area of memory cells to the minimum value of a memory transistor irrespective of a metal line pitch.

Many widely different embodiments of the present invention may be constructed without departing from the spirit and scope of the present invention. It should be understood that the present invention is not limited to the specific embodiments described in the specification, except as defined in the appended claims.

What is claimed is:

1. A memory cell array in which on a semiconductor substrate of one conduction type a plurality of diffusion wires of opposite conduction type are formed in parallel with each other, a plurality of gate wires insulated from said diffusion wires are formed in parallel with each other and perpendicularly to said diffusion wires, and a channel of a MOS transistor constituting a memory cell is defined in a region between two adjacent diffusion wires under the gate wire wherein:

the memory cell array is divided into blocks arranged into rows and columns, the diffusion wires serve as a bit line and a ground line alternately in a block, and the number of the bit lines and the ground lines in a block are respectively two, a plurality of memory cells are connected columnwise in parallel between one of the bit lines and the adjacent one of the ground lines, so that memory cells are arranged into rows and columns in a block, each of the bit lines is independent of the other bit lines which are disposed within the other blocks and also within the same block, each of the ground lines is independent of the other ground lines which are disposed within the other blocks and also within the same block, the gate wires for the memory cells serve as word lines, the bit lines are respectively connected through bit line select transistors in the same block to a line common for the columnwise blocks, the bit line select transistors have the same structure as the memory cells, and the number of the bit line select transistors in a block is two, the ground lines are respectively connected through ground line select transistors in the same block to either one of another two lines common for the columnwise blocks, the ground line select transistors have the same structure as the memory cells, and the number of the ground line select transistors in a block is four, the bit and ground line select transistors are positioned in the direction of the column at the opposite ends of the memory cells arranged into rows and columns in a block, and one of the bit line select transistors and one of the ground line select transistors are paired to select a bit line and the adjacent ground line between which memory cells are connected in parallel.

2. A memory cell array according to claim 1, wherein the semiconductor substrate is p-type and the diffusion wires are n-type.

3. A memory cell array according to claim 2, wherein gate wires forming bit line select transistors and ground line select transistors are respectively bit line select lines and ground line select lines which receive signals to select a bit line and the adjacent ground line, and lines connected to the drains of the bit line select transistors and sources of the ground line select transistors together with the word lines are selectively activated to select a memory cell in a block.

4. A memory cell array in which on a semiconductor substrate of one conduction type a plurality of diffusion wires of opposite conduction type are formed in parallel with each other, a plurality of gate wires insulated from said diffusion wires are formed in parallel with each other and perpendicularly to said diffusion wires, and a channel of a MOS transistor constituting a memory cell is defined in a region between two adjacent diffusion wires under the gate wire wherein:

the memory cell array is divided into blocks arranged into rows and columns, the diffusion wires serve as a bit line and a ground line alternately in a block, and the numbers of the bit lines and the ground lines in a block are respectively two, a plurality of memory cells are connected columnwise in parallel between one of the bit lines and the adjacent one of the ground lines, so that memory cells are arranged into rows and columns in a block, each of the bit lines is independent of the other bit lines which are disposed within the other blocks and also within the same block, each of the ground lines is independent of the other ground lines which are disposed within the other blocks and also within the same block, the gate wires for the memory cells serve as word lines, the bit lines are respectively connected through bit line select transistors in the same block to a line common for the columnwise blocks, the bit line select transistors have the same structure as the memory cells, and the number of the bit line select transistors in a block is two, the ground lines are respectively connected through ground line select transistors in the same block to another line common for the columnwise blocks, the ground line select transistors have the same structure as the memory cells, and the number of the ground line select transistors in a block is two, the bit and ground line select transistors are positioned in the direction of the column at the opposite ends of the memory cells arranged into rows and columns in a block, and one of the bit line select transistors and one of the ground line select transistors are paired to select a bit line and the adjacent ground line between which memory cells are connected in parallel.

5. A memory cell array according to claim 4, wherein the semiconductor substrate is p-type and the diffusion wires are n-type.

6. A memory cell array according to claim 5, wherein gate wires forming bit line select transistors and ground line select transistors are respectively bit line select lines and ground line select lines which receive signals to select a bit line and the adjacent ground line, and lines connected to the drains of the bit line select transistors and sources of the ground line select transistors together with the word lines are selectively activated to select a memory cell in a block.

7. A memory cell array according to claim 4, wherein a decoder is provided to selectively activate the bit line select transistors and the ground line select transistors.

8. A memory cell array according to claim 5, wherein a decoder is provided to selectively activate the bit line select transistors and the ground line select transistors.

9. A memory cell array according to claim 6, wherein a decoder is provided to selectively activate the bit line select transistors and the ground line select transistors.

* * * * *